(12) United States Patent
Allard et al.

(10) Patent No.: US 9,219,051 B2
(45) Date of Patent: Dec. 22, 2015

(54) LAMINATE PERIPHERAL CLAMPING TO CONTROL MICROELECTRONIC MODULE BSM WARPAGE

(71) Applicant: International Business Machines Corporation, Armonk, NY (US)

(72) Inventors: Stephanie Allard, Quebec (CA); Martin Beaumier, Quebec (CA); Jean-Francois Drapeau, Quebec (CA); Jean Labonte, Quebec (CA); Steven P. Ostrander, Poughkeepsie, NY (US); Sylvain Ouimet, St-Hubert (CA)

(73) Assignee: GLOBALFOUNDRIES INC., Grand Cayman (KY)

( * ) Notice: Subject to any disclaimer, the term of this patent is extended or adjusted under 35 U.S.C. 154(b) by 262 days.

(21) Appl. No.: 13/910,169

(22) Filed: Jun. 5, 2013

(65) Prior Publication Data

US 2014/0359996 A1    Dec. 11, 2014

(51) Int. Cl.
*B23Q 7/00* (2006.01)
*H01L 21/687* (2006.01)
*H01L 23/00* (2006.01)
(Continued)

(52) U.S. Cl.
CPC ............ *H01L 24/75* (2013.01); *H01L 23/3675* (2013.01); *H05K 3/00* (2013.01); *H01L 24/32* (2013.01); *H01L 24/83* (2013.01); *H01L 2224/2929* (2013.01); *H01L 2224/29387* (2013.01); *H01L 2224/32245* (2013.01); *H01L 2224/753* (2013.01); *H01L 2224/7531* (2013.01); *H01L 2224/75301* (2013.01); *H01L 2224/75314* (2013.01); *H01L 2224/8385* (2013.01); *Y10T 29/49826* (2015.01); *Y10T 29/49998* (2015.01)

(58) Field of Classification Search
CPC  H01L 21/68721; H01L 21/683; H05K 3/301; H05K 13/00; H05K 13/0061; H05K 13/0069; Y10S 414/141; Y10T 29/49998
USPC ............................... 269/254 R, 254 CS, 903
See application file for complete search history.

(56) References Cited

U.S. PATENT DOCUMENTS 4,189,230 A * 2/1980 Zasio .............................. 355/76
4,458,746 A * 7/1984 Holden et al. ............... 165/80.5

(Continued)

FOREIGN PATENT DOCUMENTS

| CN | 101587867 A | 11/2009 | |
|---|---|---|---|
| WO | WO 9608838 A1 * | 3/1996 | ............. H01L 21/00 |
| WO | WO 2006078068 A2 * | 7/2006 | ............. H05K 13/08 |

*Primary Examiner* — Essama Omgba
(74) *Attorney, Agent, or Firm* — Michael A. Petrocelli; Howard M. Cohn

(57) ABSTRACT

A clamping apparatus and method for applying a force to a workpiece during processing includes a base defining a work area. The work area is configured to receive a joined structure including a substrate and a die. A component is positionable in the work area and over the joined structure. An adjustable releasable structure is positionable over the component and the joined structure and includes a resilient mechanism having an inner member for contacting the component to apply an inner downward force to the component. The resilient mechanism also includes outer members for applying an outer downward force to opposing distal edge areas of the substrate. An external downward force is applied to the adjustable releasable structure, such that the inner and outer members apply the inner and outer downward forces to the component and the opposing distal edge areas of the substrate, respectively, during processing of the joined structure.

12 Claims, 2 Drawing Sheets

(51) Int. Cl.
*H05K 3/00* (2006.01)
*H01L 23/367* (2006.01)

(56) References Cited

U.S. PATENT DOCUMENTS

| | | | | |
|---|---|---|---|---|
| 4,473,455 A | * | 9/1984 | Dean et al. | 204/298.15 |
| 4,508,161 A | * | 4/1985 | Holden | 165/80.1 |
| 5,203,958 A | * | 4/1993 | Arai et al. | 216/67 |
| 5,316,786 A | | 5/1994 | von der Lippe et al. | |
| 5,925,226 A | * | 7/1999 | Hurwitt et al. | 204/298.15 |
| 6,000,924 A | * | 12/1999 | Wang et al. | 425/125 |
| 6,123,864 A | * | 9/2000 | Tam et al. | 216/67 |
| 6,224,936 B1 | * | 5/2001 | Gochnour et al. | 427/96.2 |
| 6,270,621 B1 | * | 8/2001 | Tam et al. | 156/345.3 |
| 6,527,999 B2 | * | 3/2003 | Gochnour et al. | 264/266 |
| 6,592,670 B1 | * | 7/2003 | Gochnour et al. | 118/500 |
| 6,764,549 B2 | * | 7/2004 | Gochnour et al. | 118/500 |
| 6,811,738 B2 | * | 11/2004 | Magni et al. | 264/510 |
| 6,830,719 B2 | * | 12/2004 | Gochnour et al. | 264/231 |
| 6,860,731 B2 | * | 3/2005 | Ho et al. | 425/112 |
| 6,969,641 B2 | | 11/2005 | Matsunami | |
| 6,988,879 B2 | * | 1/2006 | Ho et al. | 425/126.1 |
| 7,172,927 B2 | | 2/2007 | Yuan et al. | |
| 7,205,175 B2 | * | 4/2007 | Raben | 438/65 |
| 7,380,798 B2 | * | 6/2008 | Wolters | 279/2.17 |
| 7,926,162 B2 | * | 4/2011 | Wolters | 29/559 |
| 7,964,444 B2 | | 6/2011 | Sri-Jayantha | |
| 8,118,940 B2 | * | 2/2012 | Shimizu et al. | 118/728 |
| 2001/0012540 A1 | * | 8/2001 | Gochnour et al. | 427/96 |
| 2005/0048699 A1 | | 3/2005 | Matsunami | |
| 2005/0236780 A1 | * | 10/2005 | Wolters | 279/2.1 |
| 2007/0117351 A1 | * | 5/2007 | Bradl et al. | 438/460 |
| 2008/0104820 A1 | * | 5/2008 | Wolters | 29/446 |
| 2009/0200251 A1 | * | 8/2009 | Shimizu et al. | 211/41.18 |
| 2011/0232074 A1 | * | 9/2011 | Bradl et al. | 29/559 |
| 2012/0229999 A1 | * | 9/2012 | Hussain | 361/783 |
| 2014/0359995 A1 | * | 12/2014 | Blackshear et al. | 29/428 |

* cited by examiner

LAMINATE PERIPHERAL CLAMPING TO CONTROL MICROELECTRONIC MODULE BSM WARPAGE

CROSS REFERENCE TO RELATED APPLICATION

This application is related to the following commonly-owned, co-pending U.S. patent application filed on even date herewith, the entire contents and disclosure of which is expressly incorporated by reference herein: U.S. patent application Ser. No. 13/910,152, for "CONTRAINED DIE ADHESION CURE PROCESS".

BACKGROUND

1. Field

The present disclosure relates to a clamping apparatus and method for clamping a workpiece during processing.

2. Background of the Disclosure

In the area of semiconductor chip packaging, an example process for attaching a semiconductor chip module to another device includes joining a heat spreader to a joined die which includes a laminate and a die. After a heating process to bond or attach the heat spreader to the joined structure by attaching the heat spreader to the laminate, the substrate or laminate is susceptible to warping during and after the process. For example, the laminate material can warp when cooling from a cure temperature. Warping is undesirable because it can lead to die cracking, thermal interface material (TIM) tearing, and ball grid array (BGA) coplanarity failure. All of which are unacceptable in meeting chip quality control standards.

Undesirable die stresses can also result from variations in the laminate shape during processes which require heating, such as during processing of a chip/die and a laminate, for example, during bonding of a component to a die or module as discussed above. Die stresses can manifest themselves as a cracked die, or separations of the dielectric layers within the die (e.g., typically, white bumps). Increased laminate warpage (also referred to as warping) can also lead to increased module warpage at the end of a bond and assembly process, which can cause the module to fail final co-planarity specifications. Thus, substrate or laminate warpage is undesirable as discussed above.

Laminate warpage or warping may be defined by the laminate's curvature from a flat surface of the bottom of the laminate. Alternatively, laminate warpage may be defined by a planar surface mating with the bottom of the laminate, thereby providing a horizontal plane to reference any warping of the laminate.

Bottom surface metallurgy (BSM) (for example, including an array of copper pads) warpage for land grid array (LGA) (for example, surface mount packaging for integrated circuits) is desirably minimized for achieving optimal electrical contact when a module is connected to a card or board.

For example, a heat spreader may be attached to a joined chip to achieve an increased thermal performance of a chip. A force applied to a heat spreader in a heat spreader attach operation may also bend the laminate of the joined die, flipping the edges upward and changing the overall shape of the BSM. This change of shape increases a BSM warpage value. The processed module may have a warpage specification. Thus, warpage of the BSM caused by laminate warping can have undesirable consequences in meeting specification for a module.

Referring to FIGS. 1-3, an example embodiment of a prior art joining process and joining device (also can be referred to as a clamping fixture) for applying a force to a joined die and heat spreader during processing is discussed below. The joining process shown in FIGS. 1-3 includes using a joining device including a base 10 having opposing support walls 12 extending upwardly from the base and defining a work area 14. The work area is designed to accept a joined die having a laminate 20 and a die 24 over the laminate. A joined die includes a laminate 20 having distal ends 22 which are turned downwardly. A die 24 is attached to the laminate 20.

Referring to FIG. 2, alignment members 30 are positioned over the support walls 12. A thermal interface material (TIM) 34 is layered over the top of the die 24. Structural adhesive patches 38 are positioned on the laminate. As shown in FIG. 3, a heat spreader 40 is positioned over the joined die such that legs 42 of the heat spreader contact the structural adhesive patches 38. A plate 50 includes a spring 54, and is placed over the base and joined die and heat spreader such that the spring contacts the heat spreader.

During a curing process to join the heat spreader 40 to the die and laminate, pressure 60 (that is, a force) is applied to the plate 50. The pressure 60 assists in successfully joining the heat spreader to the die and laminate. However, the ends 22 of the laminate are turned (or flipped) upwardly. This turning or flipping of the laminate is undesirable as the laminate is preferred to be substantially planar for attaching the laminate and thus the joined die to a circuit board or the like.

BRIEF SUMMARY

It would be desirable to reduce the warping of substrates such as a laminate after a heating or curing process, for a joined structure, e.g., joined die including a laminate. It would therefore also be desirable to provide an apparatus and method for constraining a laminate and a joined structure during processing.

In an embodiment according to the invention, a clamping apparatus for applying a force to a workpiece during processing includes a base having opposing support walls defining a work area. The work area is configured to receive a joined structure including a substrate and a die positioned over the substrate. A component is positionable in the work area and over the joined structure. An adjustable releasable structure includes a resilient mechanism. The releasable structure is configured to be positioned over the component and the joined structure. The resilient mechanism includes an inner member configured to contact the component to apply an inner downward force to the component, and outer members configured to apply an outer downward force to opposing distal edge areas of the substrate. An external downward force is applied to the adjustable releasable structure, such that the inner and outer members apply the inner and outer downward forces to the component and the opposing distal edge areas of the substrate, respectively, during a process of the joined structure.

In another embodiment according to the invention, a method of manufacturing a clamping apparatus for applying a force to a workpiece during processing includes, positioning opposing support walls on a base to define a work area. The work area is configured to receive a joined structure including a substrate and a die positioned over the substrate. A component is positionable in the work area and over the joined structure. An adjustable releasable structure is configured to be positioned over the component. The releasable structure includes a resilient mechanism having an inner member configured to contact the component to apply an inner downward force to the component. Outer members are configured to apply an outer downward force to opposing distal edge areas of the substrate. When an external downward force is applied to the adjustable releasable structure, the inner and outer members apply the inner and outer downward forces to the component and the opposing distal edge areas of the substrate, respectively, during a process of the joined structure.

In another embodiment according to the invention, a method of applying a force to a workpiece during processing includes the steps of: positioning a joined structure including a substrate and a die positioned over the substrate into a work area defined by a base including opposing support walls. A component is positionable in the work area and over the joined structure. An adjustable releasable structure including a resilient mechanism is positioned over the component. The resilient mechanism including an inner member configured to contact the component to apply an inner downward force to the component, and outer members configured to apply an outer downward force to opposing distal edge areas of the substrate. Wherein when applying an external downward force to the adjustable releasable structure, the inner and outer members apply the first and second downward forces to the component and the opposing distal edge areas of the substrate, respectively, during a process of the joined structure.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
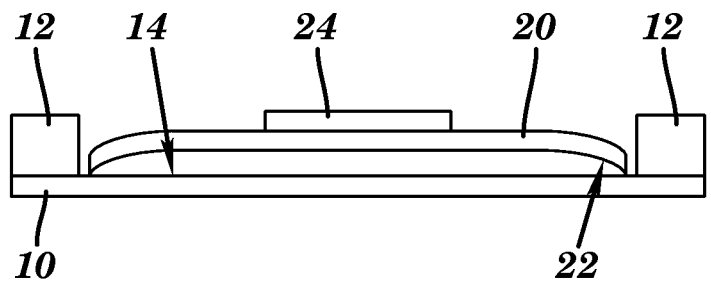
FIG. 1 is a cross sectional side elevational view of part of a prior art clamping fixture or joining device which includes a base, and a joined die on the base wherein the ends of a laminate are downturned.
Figure 2:
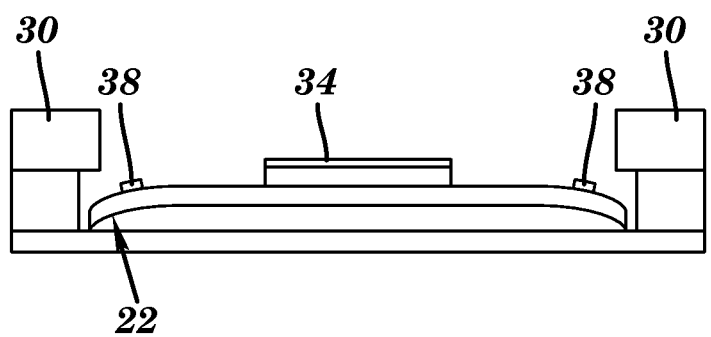
FIG. 2 is a cross sectional side elevational view of the prior art clamping fixture shown in FIG. 1 further including alignment members.
Figure 3:
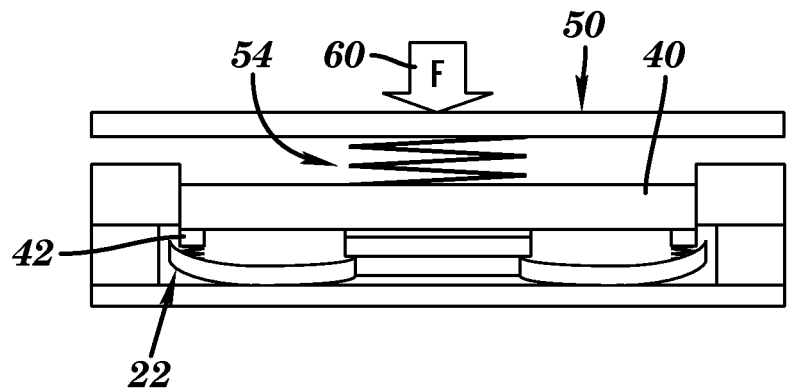
FIG. 3 is a cross sectional side elevational view of the prior art clamping fixture shown in FIG. 2 further including a heat spreader positioned using the alignment members for attachment to the joined die, and the joining device includes a spring and plate arrangement for applying a force to the heat spreader during curing, wherein the ends of the laminate are upturned after the curing process.
Figure 4:
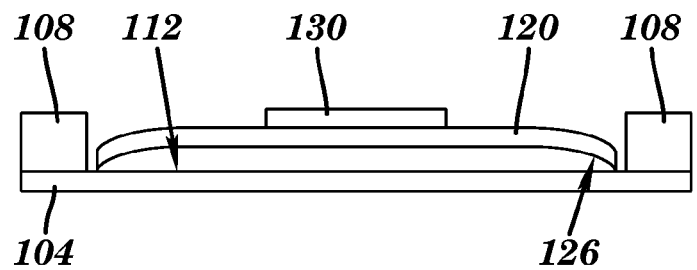
FIG. 4 is a cross sectional side elevational view of part of a clamping apparatus according to an embodiment of the invention, which includes a base and support walls for positioning a joined structure, wherein the joined structure can include a laminate having ends which are downturned.

Referring to FIGS. 4-7, a clamping apparatus 200 (shown in FIG. 6 and defined below) for applying a force to a workpiece during processing, according to an embodiment of the invention, includes a base 104 having opposing support walls 108 defining a work area 112. A joined structure embodied as a laminate 120 and a die 130 is positioned in the work area 112. The joined structure of the present disclosure may also be referred to as a joined die. The ends 126 of the laminate 120 are turned downwardly.

Figure 5:
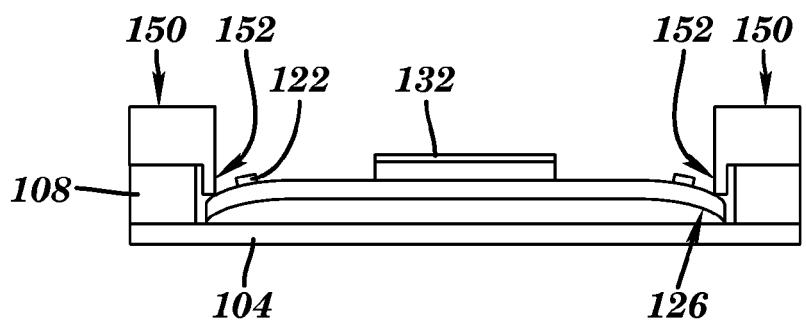
FIG. 5 is a cross sectional side elevational view of the clamping apparatus shown partially in FIG. 4 further including alignment members.

Referring to FIG. 5, opposing alignment members 150 are positioned over the support walls 108, as shown in FIG. 5. The alignment members 150 each include a downwardly extending inner flange 152 which are configured to contact distal opposing edge areas, for example, the distal ends 126 of the laminate 120. A thermal interface material (TIM) 132 is layered over the top of the die 130. Structural adhesive patches 122 are positioned on the laminate 120.

Figure 6:
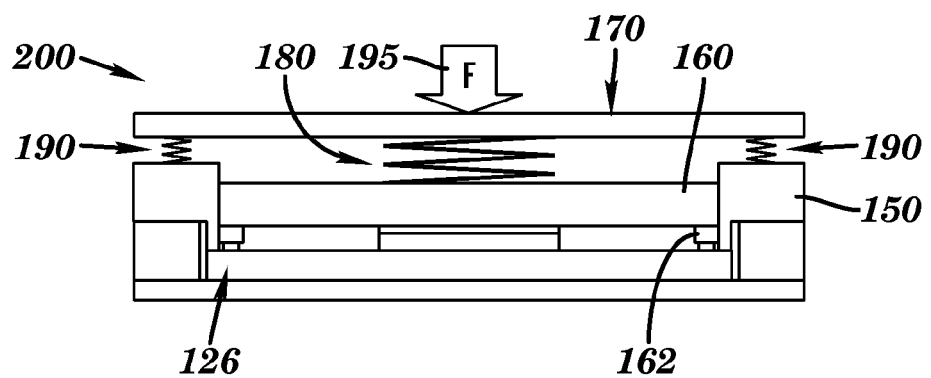
FIG. 6 is a cross sectional side elevational view of the clamping apparatus shown partially in FIG. 5 further including an adjustable releasable structure having a resilient mechanism positioned over a heat spreader for applying a force to the heat spreader during heating or curing to attach the heat spreader to the joined structure, the laminate ends are restrained in a substantially planar position during curing with the clamping apparatus in a locked position.

As shown in FIG. 6, a component, embodied as a heat spreader 160 is positioned over the joined structure such that legs 162 of the heat spreader contact the structural adhesive patches 122. In alternative embodiments other components can be joined to a die or to other components.

An adjustable releasable structure including a resilient mechanism is embodied as a plate 170, and an inner spring 180 and opposing alignment member outer springs 190, as the resilient mechanism. The inner spring 180 is an embodiment of an inner member, and the outer springs 190 are an embodiment of outer members. The inner spring 180 is configured to apply an inner downward force to the heat spreader, and the outer springs 190 are configured to apply an outer downward force to the alignment members 150. The plate 170 is positioned over the base, alignment members, and the heat spreader. The inner spring 180 is positioned over the heat spreader 160. The outer springs 190 are positioned over the alignment members 150. Thus, the outer springs 190 and the inner spring 180 are positioned between the plate 170, and the alignment members 150 and heat spreader, respectively.

The clamping apparatus thereby includes the plate 170, springs 190, 180, the alignment members 150, the support walls 108 and the base 104, as shown in their configured state in FIG. 6.

When an external downward force 195 is applied to the plate 170, the springs 180, 190 apply inner and outer downward forces to the heat spreader 160 and the opposing distal ends 126 of the laminate 120, respectively, as a result of the external force 195 applied to the plate 170. Thereby, the heat spreader in compressed against the top of the die 130, and the downwardly extending inner flanges 152 compress the ends 126 of the laminate as shown in FIG. 6. The ends 126 of the laminate are substantially planar. With the force 195 applied to the plate 170, and the springs 180, 190 applying force as described above, the clamping apparatus is in a locked position. The locked clamping apparatus can remain in place while the joined structure is processed, for example, by being placed in a processing chamber to attach the heat spreader to the die and laminate (via the structural adhesives), by heating the entire package shown in FIG. 6.

Additionally, the length of the inner and outer springs 180, 190 can be adjusted to affect the inner and outer downward forces on the respective heat spreader and laminate. The length of the springs 180, 190 can be the same, that is, to provide their respective inner and outer downward forces in unison with the external downward force 195. Alternatively, the length of the outer springs 190 can be longer than the inner spring 180, such that when the external force 195 is applied, the outer springs apply the outer force to the alignment members and thereby flatten the edges of the laminate via the inner flanges 152, before the inner downward force from the inner spring is applied to the heat spreader. This sequence allows the laminate to be substantially planar before the heat spreader legs 162 are pressured against, and bonded to, the structural adhesive patches 122. Also, this sequence prevents the inner flanges 152 from loosening the bond between the heat spreader legs 162 and the structural adhesive patches 122 if the inner flanges pressure the laminate after the bonding the two has occurred.

Thereby, the present disclosure enables peripheral laminate clamping, that applies the force 195 onto edges of the laminate during a heat spreader attach operation to prevent the laminate edges from flipping upward. The laminate edges are substantially planarized while the clamping apparatus is in the locked position. In addition, the central spring 180 not only applies the force 195 to the heat spreader and the die beneath the heat spreader to bond the heat spreader to the die, the force is applied to the laminate below as well. Thus, some planarization of the laminate below the die area also results from the application of the force 195.

Further, the alignment members 150 are shown in FIGS. 5 and 6 in cross section, in the embodiment of the present disclosure shown herein, however, alternatively the alignment members can extend from a plate or an alignment plate extending parallel and over the heat spreader.

Figure 7:
FIG. 7 is a cross sectional side elevational view of the joined structure and heat spreader shown in FIG. 6, having the clamping apparatus removed (or unlocked) wherein the laminate ends remain in a substantially planar position after heating or curing.

After the heating process for attachment of the heat spreader, the clamping apparatus can be unlocked, wherein the plate 170, springs, and alignment members are removed, as shown in FIG. 7. The laminate ends 126 remain substantially planar after the heating process. A planar laminate is advantageous for attaching the joined chip (also may be referred to as a chip package or module) to a board, e.g., a printed circuit board (PCB) or the like, using land grid array (LGA) connector technology.

Thereby, in sum, the present disclosure according to one embodiment provides a clamping apparatus for applying a force to a workpiece during processing according to an embodiment of the invention. The clamping apparatus includes the base 104 having opposing support walls 108 defining the work area 112. The work area is configured to receive the joined structure including the substrate embodied as the laminate 120 and the die 130 positioned over the substrate. A component, embodied as the heat spreader 160 is positionable in the work area and over the joined structure. The opposing alignment members 150 each include the downwardly extending inner flange 152 configured to contact distal opposing edge areas of the substrate 120. The adjustable releasable structure includes the plate 170 and the resilient mechanism configured to be positioned over the component. The resilient mechanism includes the inner member, embodied as spring 180 which is configured to contact the component to apply an inner downward force to the component, and the outer members, embodied as springs 190 configured to apply an outer downward force to opposing distal edges 126 of the substrate. When an external downward force is applied to the adjustable releasable structure, the inner and outer members apply the inner and outer downward forces to the component and the opposing distal edge areas of the substrate, respectively, during a process of the joined structure.

In operation, the present disclosure, according to one embodiment, provides a method of using a clamping apparatus for applying a force to a workpiece during processing, according to an embodiment of the invention. The joined structure including the substrate embodied as the laminate 120 and the die 130 which is positioned over the substrate are positioned into the work area 112 defined by the base 104 which includes opposing support walls 108. The component 160 is positionable in the work area and over the joined structure. The opposing alignment members 150 each include the downwardly extending inner flange 152 configured to contact distal opposing edges 126 of the substrate. The adjustable releasable structure including the plate 170 includes the resilient mechanism over the component wherein the resilient mechanism includes the inner member 180 configured to contact the component to apply the inner downward force to the component, and the outer members 190 configured to apply the outer downward force to the opposing distal edges of the substrate. Applying the external downward force 195 to the adjustable releasable structure, e.g., the plate 170, the inner and outer members apply the inner and outer downward forces to the component and the opposing distal edges of the substrate, respectively, during the process of the joined structure.

In an alternative implementation, a load can be applied to the bottom of the laminate and particularly the ends 126 of the laminate (or in other embodiments a substrate or other flexible material) using a vacuum.

While embodiments of the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A clamping apparatus for applying a force to a workpiece during processing, comprising:
   a base including opposing support walls defining a work area, the work area configured to receive a joined structure including a substrate and a die positioned over the substrate, a component being positionable in the work area and over the joined structure; and
   an adjustable releasable structure including a resilient mechanism, the releasable structure configured to be positioned over the component and the joined structure, the resilient mechanism including an inner member being configured to contact the component to apply an inner downward force to the component, and outer members being configured to apply an outer downward force to opposing distal edge areas of the substrate, wherein when an external downward force is applied to the adjustable releasable structure, the inner and outer members apply first and second downward forces to the component and the opposing distal edge areas of the substrate, respectively, during a process of the joined structure, and further comprising:
   opposing alignment members positioned over the opposing support walls, the opposing alignment members configured to position the component over the joined structure, the opposing alignment members each include a downwardly extending inner flange configured to contact the opposing distal edge areas of the substrate; and
   the outer members of the resilient mechanism being configured to contact the opposing alignment members, wherein when the external downward force is applied to the adjustable releasable structure, the inner and outer members apply the inner and outer downward forces to the component and the opposing alignment members, respectively, and the external downward force is thereby applied to the opposing distal edge areas of the substrate via the inner flanges during the process, and wherein the inner and outer members are coupled to a plate of the adjustable releasable structure, and the outer members are positionable between the plate and the opposing alignment members, the outer members configured to provide the outer downward force to the inner flanges and thereby the opposing distal edge areas in concert with the force applied to the adjustable releasable structure.

2. The apparatus of claim 1, wherein the adjustable releasable structure includes a planar member and the inner member is a substantially central resilient member couplable to a top surface of the component, and the outer members are opposing resilient members couplable to a top surface of each the opposing alignment members, respectively.

3. The apparatus of claim 2, wherein the inner and outer members are springs.

4. The apparatus of claim 1, wherein the joined structure includes a first element positioned over a portion of a second element.

5. The apparatus of claim 4, wherein the first element is a die and the second element is a laminate, and the component is a heat spreader.

6. The apparatus of claim 5, wherein a thermal interface material layer is between the heat spreader and the die.

7. The apparatus of claim 5, wherein structural adhesive areas are positioned between opposite extended legs of the heat spreader and the laminate such that the heat spreader is coupled to the laminate.

8. The apparatus of claim 1, wherein a gap is defined between each of the inner flanges and the opposing support walls.

9. The apparatus of claim 1, further comprising:
an engaged position wherein the inner member contacts the component, the outer members contact the edge areas of the substrate, and the releasable structure transfers the external downward force to the component and the edge areas of the substrate via the inner and outer members, respectively, wherein the clamping apparatus remains in the engaged position through the process on the joined structure; and
a disengaged position wherein the inner and outer members of the resilient mechanism are not in contact with the component and the substrate, respectively.

10. The apparatus of claim 1, wherein the joined structure includes a first element positioned over a portion of a second element, the inner flanges being closer to opposing edges of the second element than opposing legs extending downwardly from the component, the opposing legs being attached adjacent to opposing ends of the component.

11. A method of manufacturing a clamping apparatus for applying a force to a workpiece during processing, comprising:
positioning opposing support walls on a base to define a work area, the work area configured to receive a joined structure including a substrate and a die positioned over the substrate, a component being positionable in the work area and over the joined structure; and
configuring an adjustable releasable structure to be positioned over the component, the releasable structure including a resilient mechanism having an inner member being configured to contact the component to apply an inner downward force to the component, and outer members being configured to apply an outer downward force to opposing distal edge areas of the substrate, wherein when an external downward force is applied to the adjustable releasable structure, the inner and outer members apply the inner and outer downward forces to the component and the opposing distal edge areas of the substrate, respectively, during a process of the joined structure, and further comprising:
positioning opposing alignment members over the opposing support walls, the opposing alignment members configured to position the component over the joined structure, the opposing alignment members each include a downwardly extending inner flange configured to contact the opposing distal edge areas of the substrate; and
coupling the outer members to the releasable structure, the outer members of the resilient mechanism being configured to contact the opposing alignment members, wherein when the external downward force is applied to the adjustable releasable structure, the inner and outer members apply the inner and outer downward forces to the component and the opposing alignment members, respectively, and the external downward force is thereby applied to the opposing distal edge areas of the substrate via the inner flanges during the process;
coupling the inner and outer members to a plate of the adjustable releasable structure, the outer members being positionable between the plate and the opposing alignment members, and the outer members configured to provide the outer downward force to the inner flanges and thereby the opposing distal edge areas in concert with the force applied to the adjustable releasable structure; and
wherein the adjustable releasable structure includes a planar member and the inner member is a substantially central resilient member couplable to a top surface of the component, and the outer members are opposing resilient members couplable to a top surface of each of the opposing alignment members, respectively.

12. A method of applying a force to a workpiece during processing, comprising the steps of:
positioning a joined structure including a substrate and a die positioned over the substrate into a work area defined by a base including opposing support walls, a component being positionable in the work area and over the joined structure; and
positioning an adjustable releasable structure including a resilient mechanism over the component, the resilient mechanism including an inner member being configured to contact the component to apply an inner downward force to the component, and outer members being configured to apply an outer downward force to opposing distal edge areas of the substrate;
applying an external downward force to the adjustable releasable structure, the inner and outer members apply the first and second downward forces to the component and the opposing distal edge areas of the substrate, respectively, during a process of the joined structure, further comprising:
positioning the component over the joined structure using opposing alignment members positioned over the opposing support walls, the opposing alignment members each include a downwardly extending inner flange configured to contact the opposing distal edge areas of the substrate; and
coupling the outer members of the resilient mechanism to the opposing alignment members, wherein when the external downward force is applied to the adjustable releasable structure, the inner and outer members apply the inner and outer downward forces to the component and the opposing alignment members, respectively, and the external downward force is thereby applied to the opposing distal edge areas of the substrate via the inner flanges during the process; and wherein the inner and outer members are coupled to a plate of the adjustable releasable structure, and the outer members are positionable between the plate and the opposing alignment members, the outer members configured to provide the outer downward force to the inner flanges and thereby the opposing distal edge areas in concert with the force applied to the adjustable releasable structure; and wherein the adjustable releasable structure includes a planar member and the inner member is a substantially central resilient member couplable to a top surface of the component, and the outer members are opposing resilient members couplable to a top surface of each the opposing alignment members, respectively.

* * * * *